(12) United States Patent
Rakshit et al.

(10) Patent No.: US 10,026,751 B2
(45) Date of Patent: Jul. 17, 2018

(54) SEMICONDUCTOR DEVICE INCLUDING A REPEATER/BUFFER AT HIGHER METAL ROUTING LAYERS AND METHODS OF MANUFACTURING THE SAME

(71) Applicant: Samsung Electronics Co., Ltd., Suwon-si, Gyeonggi-do (KR)

(72) Inventors: Titash Rakshit, Austin, TX (US); Borna J. Obradovic, Leander, TX (US); Rwik Sengupta, Austin, TX (US); Wei-E Wang, Austin, TX (US); Ryan Hatcher, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/210,867

(22) Filed: Jul. 14, 2016

(65) Prior Publication Data

US 2017/0098661 A1    Apr. 6, 2017

Related U.S. Application Data

(60) Provisional application No. 62/236,807, filed on Oct. 2, 2015.

(51) Int. Cl.

| | |
|---|---|
| *H01L 27/01* | (2006.01) |
| *H01L 27/12* | (2006.01) |
| *H01L 23/522* | (2006.01) |
| *H01L 23/528* | (2006.01) |
| *H01L 29/24* | (2006.01) |

(Continued)

(52) U.S. Cl.
CPC ............. *H01L 27/12* (2013.01); *H01L 21/84* (2013.01); *H01L 23/528* (2013.01); *H01L 23/5226* (2013.01); *H01L 23/5228* (2013.01); *H01L 29/1033* (2013.01); *H01L 29/24* (2013.01); *H01L 29/42376* (2013.01);
(Continued)

(58) Field of Classification Search
CPC ....... H01L 29/785; H01L 29/16; H01L 29/78; H01L 27/11; H01L 27/1214; H01L 23/5286; H01L 27/12
USPC ........................................................ 257/351
See application file for complete search history.

(56) References Cited

U.S. PATENT DOCUMENTS

| | | |
|---|---|---|
| 7,094,651 B2 | 8/2006 | Mitzi et al. |
| 7,494,841 B2 | 2/2009 | Mitzi et al. |

(Continued)

OTHER PUBLICATIONS

Banerjee, et al.; 3-D ICs: A Novel Chip Design for improving Deep-Submicrometer Interconnect Performance and Systems-on-Chip Integration; Proceedings of the IEEE, vol. 89, No. 5, May 2001, pp. 602-633.

(Continued)

*Primary Examiner* — Theresa T Doan
(74) *Attorney, Agent, or Firm* — Lewis Roca Rothgerber Christie LLP

(57) ABSTRACT

A semiconductor device includes a series of metal routing layers and a complementary pair of planar field-effect transistors (FETs) on an upper metal routing layer of the metal routing layers. The upper metal routing layer is M3 or higher. Each of the FETs includes a channel region of a crystalline material. The crystalline material may include one or more transition metal dichalcogenide materials such as $MoS_2$, $WS_2$, $WSe_2$, and/or combinations thereof.

17 Claims, 6 Drawing Sheets

(51) Int. Cl.
*H01L 29/45* (2006.01)
*H01L 29/78* (2006.01)
*H01L 29/423* (2006.01)
*H01L 29/66* (2006.01)
*H01L 21/84* (2006.01)
*H01L 29/10* (2006.01)

(52) U.S. Cl.
CPC ........ *H01L 29/45* (2013.01); *H01L 29/66969* (2013.01); *H01L 29/78* (2013.01)

(56) References Cited

U.S. PATENT DOCUMENTS

| | | | |
|---|---|---|---|
| 8,039,926 B2 | 10/2011 | Song et al. | |
| 8,916,914 B2 | 12/2014 | Kim et al. | |
| 2004/0266045 A1* | 12/2004 | Mears | B82Y 10/00 438/47 |
| 2006/0205124 A1* | 9/2006 | Herner | H01L 21/84 438/149 |
| 2014/0117421 A1* | 5/2014 | Seo | H01L 21/823418 257/288 |
| 2014/0131698 A1 | 5/2014 | Kim et al. | |
| 2014/0197459 A1 | 7/2014 | Kis et al. | |
| 2015/0200308 A1 | 7/2015 | Karda et al. | |

OTHER PUBLICATIONS

Tosun, et al.; High-Gain Inverters Based on $WSe_2$ Complementary Field-Effect Transistors; ACSNANO, vol. 8, No. 5, 4948-4953, 2014, pp. 4948-4953.

Das, et al.; Electrostatically Doped $WSe_2$ CMOS Inverter; Center for Nanoscale Materials,© 2014 IEEE, pp. 185-186.

Tao, et al.; The energy-band alignment at molydbenum disulphide and high-k dielectrics interfaces; Applied Physics Letters 104; © 2014 AIP Publishing LLC, 4 sheets.

Mejia, et al.; Low-Temperature Hybrid CMOS Circuits Based on Chalcogenides and Organic TFTs; IEEE Electron Device Letters, vol. 32, No. 8, Aug. 2011, pp. 1086-1088.

Ye; Device Perspective of 2D Materials Beyond Graphene; Proceedings of the 14th IEEE International Conference on Nanotechnology, Aug. 18-21, 2014, pp. 896-897.

* cited by examiner

SEMICONDUCTOR DEVICE INCLUDING A REPEATER/BUFFER AT HIGHER METAL ROUTING LAYERS AND METHODS OF MANUFACTURING THE SAME

CROSS-REFERENCE TO RELATED APPLICATION(S)

This utility patent application claims priority to and the benefit of U.S. Provisional Patent Application Ser. No. 62/236,807, filed Oct. 2, 2015, entitled "LOW TEMPERATURE GROWN 2D METAL DICHALCOGENIDE MATERIAL-BASED CIRCUITS INCLUDING REPEATER/BUFFER INSERTED AT HIGHER METAL LAYERS," the entire content of which is incorporated herein by reference.

FIELD

One or more aspects of example embodiments of the present invention relate to semiconductor devices including transistors at upper metal routing layers.

BACKGROUND

Overall chip performance may be severely limited by interconnect performance for chips at scaled nodes, e.g., the 7 nm node and beyond. As feature sizes are scaled, metal pitches and transistors are also scaled. The reduction in metal pitch (i.e., reducing the distance between the metal lines), can result in an increase in capacitance per unit length. Furthermore, a reduction in the cross-sectional area of the interconnect, associated also with a reduction in metal pitches, can result in a non-linear increase in the resistivity of the interconnect, thus increasing (e.g., degrading) the interconnect via and line resistances and further worsening (e.g., degrading) overall chip performance.

To compensate for high via and line resistances, repeaters may be inserted to boost the signal level for long routing wires, e.g., wires higher than in metal2 layer. At the 7 nm and beyond, repeaters may be inserted much more frequently due to the non-linear increase in line resistances. However, repeaters may also be degraded due to high via resistances that are used to connect repeaters to higher metal routing layers. Furthermore, due to the increase in number of repeaters and width of the repeaters required, they may consume a significant area of the chip at a scaled node.

The above information disclosed in this Background section is provided for enhancement of understanding of the background of the invention, and therefore, it may contain information that does not constitute prior art.

SUMMARY

The present disclosure is directed to various embodiments of a semiconductor device. In one embodiment, the semiconductor device includes a series of metal routing layers and a pair of planar field effect transistors (FETs) on an upper metal routing layer of the metal routing layers. Each of the FETs includes a channel region formed of a crystalline material.

The crystalline material may include one or more transition metal dichalcogenide materials, such as $MoS_2$, $WS_2$, $WSe_2$, or combinations thereof.

The crystalline material may have a bandgap of at least 1 eV (e.g., at least 1.1 eV) and a mobility of at least 75 $cm^2/V$-sec.

The one or more transition metal dichalcogenide materials may have a thickness of less than 10 monolayers, such as a thickness of 1 to 5 monolayers.

The semiconductor device may not include shallow trench isolation (STI) between the pair of planar FETs to isolate them from each other.

Each FET may include source and drain regions including the crystalline material of the channel region.

Each FET may include a pair of electrodes directly contacting the source and drain regions with no silicide formation between the pair of electrodes and the source and drain regions.

The pair of planar FETs may be in an inverter configuration.

The FETs may be arranged in a repeater/buffer circuit including one Via or no Vias.

Each FET may include a gate stack including non-crystalline materials.

The present disclosure is also directed to various embodiments of methods of manufacturing a semiconductor device. In one embodiment, the method of manufacturing a semiconductor device includes depositing a first interlayer dielectric on an upper metal routing layer (e.g., M3 or greater), forming a crystalline material at a low temperature on the first interlayer dielectric, depositing NMOS workfunction material on the crystalline material, and depositing PMOS workfunction material on the crystalline material. The crystalline material includes one or more transition metal dichalcogenide materials such as $MoS_2$, $WS_2$, $WSe_2$, or combinations thereof.

The low temperature at which the crystalline material is formed on the first interlayer dielectric may be less than 450° C.

The method may include depositing a second interlayer dielectric on the NMOS workfunction material and the PMOS workfunction material.

The one or more transition metal dichalcogenide materials may have a thickness of less than 10 monolayers.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

DETAILED DESCRIPTION

Figure 1:
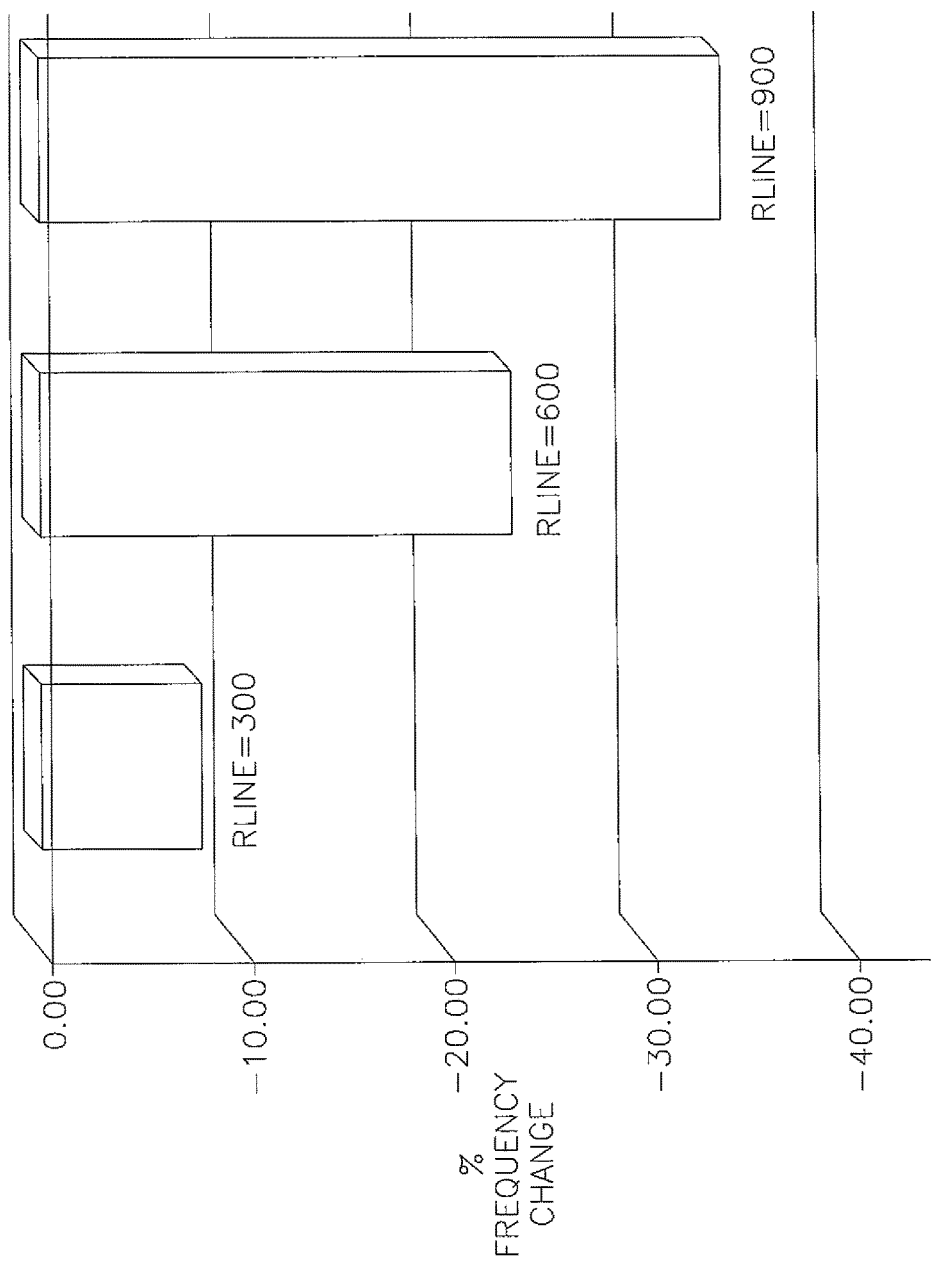
FIG. 1 is a graph showing why repeaters may be utilized in one or more embodiments according to the present invention.

The present disclosure is directed to various embodiments of a semiconductor device including one or more transistors on or between the upper metal routing layers of the semiconductor device. The one or more transistors may be combined with other transistors to form a circuit, such as a repeater/buffer circuit. The one or more transistors may include one or more monolayers of a 2D transition metal dichalcogenide (TMD) material grown at a low temperature that is compatible with the underlying layers of the semiconductor device. Additionally, the semiconductor device according to one or more embodiments of the present disclosure may include reduced or limited Vias in the repeater/buffer circuit compared to a repeater/buffer circuit formed below the metal routing layers of the semiconductor device. The reduction in the number of Vias from the repeater/buffer circuit to the metal routing layers of the semiconductor device reduces interconnect resistance, which might otherwise be a performance bottleneck in scaled technology nodes (e.g., 7 nm node and beyond). Additionally, positioning the repeater/buffer circuit in or between the routing layers avoids the loss of performance from middle of line (MOL) capacitances, creates a larger transistor area that can be realized from a larger metal pitch, and enables a longer gate length that improves electrostatic integrity, which leads to lower leakage and reasonable threshold voltage (Vt). Further, positioning the repeater/buffer circuit in or between the upper metal routing layers will free up area in a base layer of the semiconductor device for usage by other transistor functions and will improve congestion due to more metals being available for routing. Positioning the repeater/buffer circuit in or between the upper metal routing layers may also improve the net routing delay, even if the repeater/buffer circuit is not as high performance as a circuit formed by use of the transistors in the base layer.

Additionally, positioning the repeater/buffer circuit in or between the upper metal routing layers will reduce the number of repeaters and associated interconnect length. Thus opens up area to insert other functionalities on-chip.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a graph 100 illustrating increasing delay degradation to processor speeds as the line resistance (Rline) at, for example, the upper metal routing layer M4, increases. It can be seen in the graph 100, for the case of a fixed via resistance Rvia, the processor frequency degrades due to delay in the signal lines as the M4 resistance increases. Graph 100 depicts processor frequency at approximately 0.7V. For example, according to the graph 100, when the M4 resistance Rline increases to 300 ohms/μm (from a reference value), the frequency decreases by about 10%. When the M4 resistance Rline increases to 600 ohms/μm, the frequency decreases by over 20%, and when the M4 resistance Rline increases to 900 ohms/μm, the frequency decreases by over 30%.

Accordingly, FIG. 1 shows why repeaters may be needed to overcome the delay degradation to processor speed as the, for example, M4 resistance increases.

Figure 2:
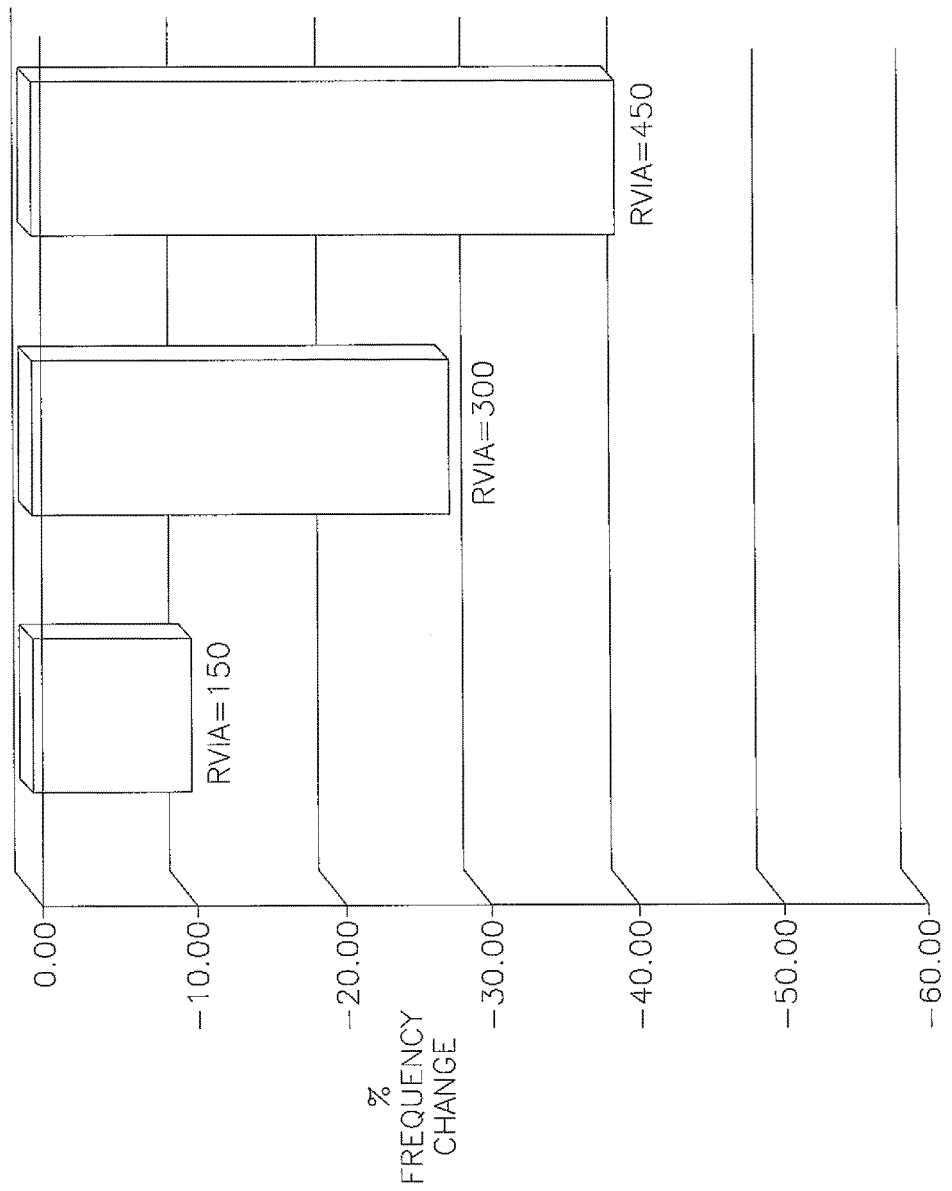
FIG. 2 is a graph showing why repeaters may be utilized in the upper layers to circumvent high via resistances in one or more embodiments according to the present invention.

FIG. 2 is a graph 200 illustrating increasing delay degradation to processor speeds as the via resistance (Rvia) increases. It can be seen in the graph 200, for the case of a fixed Rline, the processor frequency degrades due to delay in the signal lines as Rvia increases. Graph 200 depicts processor frequency at approximately 0.7V. For example, according to the graph 200, when Rvia increases to 150 ohms (from a reference value), the frequency decreases by about 10%. When the via resistance Rvia increases to 300 ohms, the frequency decreases by about 30%, and when the via resistance Rvia increases to 450 ohms, the frequency decreases by about 40%. Accordingly, the graph 200 in FIG. 2 shows why repeaters may be needed to overcome the delay degradation in processor speeds as the via resistance increases.

Figure 3:
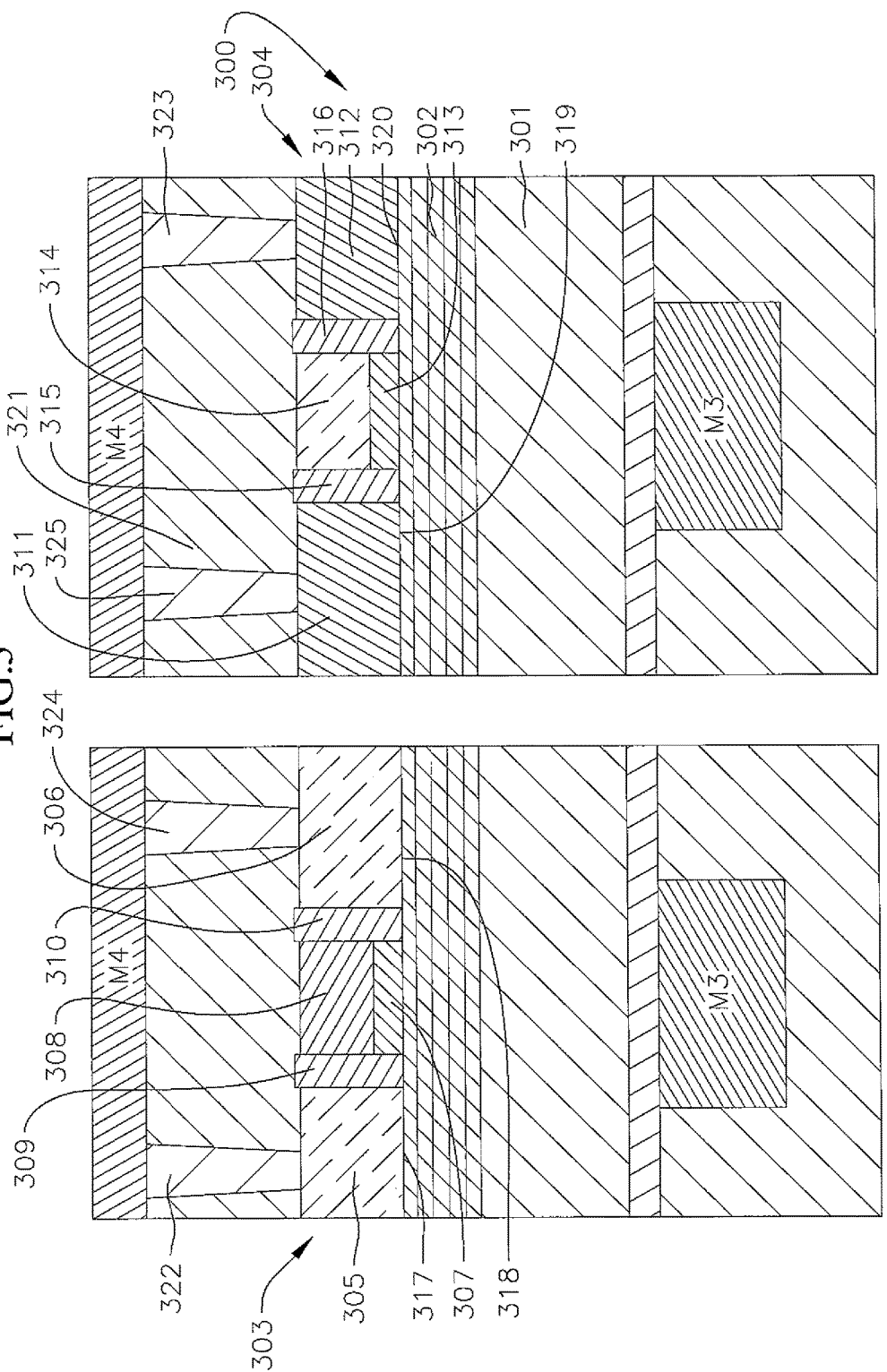
FIG. 3 is a schematic cross-sectional view of semiconductor device including a repeater inserted on an upper metal routing layer according to one or more example embodiments of the present invention.

FIG. 3 is a schematic cross-sectional view of a repeater 300 inserted at an upper metal routing layer (e.g., M3 or above) of a semiconductor device according to one or more example embodiments of the present invention. In the illustrated embodiment, the repeater 300 is inserted between metal routing layer M3 (which is embedded in an insulation layer) and metal routing layer M4. In one or more embodiments, the repeater 300 may be inserted between any other suitable upper metal routing layers, such as, for instance, between metal routing layer M4 and metal routing layer M5. As described above, repeaters may be inserted more frequently at the 7 nm node and beyond to boost the signal level for long routing wires due to non-linear increase in resistances. However, repeaters may be degraded due to high via resistances and may consume significant area. Inserting the repeater 300 at the higher metal routing layers, as in one or more example embodiments according to the present invention, is configured to also reduce or minimize the effect of high via resistances.

As can be seen in FIG. 3, according to one or more example embodiments of the present invention, the repeater 300 includes a first inter-layer dielectric (ILD) layer (i.e., a first ILD layer) 301 on the metal routing layer M3 and the insulation layer in which metal routing layer M3 is embedded. In one or more embodiments, the first ILD layer 301 may be made of any suitable material (e.g., having a suitably small dielectric constant, such as, for instance, fluorine-doped silicon dioxide or carbon-doped silicon dioxide).

As can be seen in FIG. 3, according to one or more example embodiments of the present invention, the repeater 300 also includes a transition metal dichalcogenide (TMD) layer (a TMD layer) 302 formed on the first ILD layer 301. The TMD layer 302 according to one or more example embodiments is a low temperature 2D layer, and may be made of one or more crystalline, or substantially crystalline, transition metal dichalcogenide (TMD) materials, such as $MoS_2$, $WS_2$ and/or $WSe_2$. In one or more embodiments, the TMD layer 302 may include 10 or fewer monolayers, such as, for instance, from 1 to 5 monolayers of a crystalline TMD material.

As a semiconducting material, TMD materials $MoS_2$, $WS_2$ and $WSe_2$ show excellent properties of high bandgap (for low leakage) and reasonable mobility (for currently flow). Additionally, the 2D material enables growth of the TMD layer 302 on the first ILD layer 301 at a low temperature (e.g., 450° C. or less, such as 400° C.) that is compatible with back-end-of-line (BEOL) thermal budget. For instance, low temperature grown crystalline TMD materials processing is compatible with the underlying interconnect layers (e.g., the underlying routing layers), especially Cu.

Further, growing the TMD layer 302 monolayer by monolayer gives the ability to precisely control and tune the channel thickness. Thickness control may be important for repeaters in the upper routing layers because the thickness of the stack controls electrostatic integrity of the device and makes it work like a fully depleted semiconductor on insulator device. This simplifies the process for transistor fabrication at upper routing layers and circumvents the use or utilization of a TriGate or finFET or nanosheet architecture for electrostatic immunity. A slightly longer channel length coupled with a very thin layer of $MoS_2$ or $WS_2$ can match the threshold voltage (Vt) of a base layer finFET or nanosheet FET at iso-leakage. Materials like $MoS_2$ and $WS_2$ also have a high bandgap and can be driven to higher voltages to drive higher currents without causing high field degradations like BTI and avalanche and leakages. Higher voltages lead to higher drive currents, which lead to better repeater performance.

Figure 4:
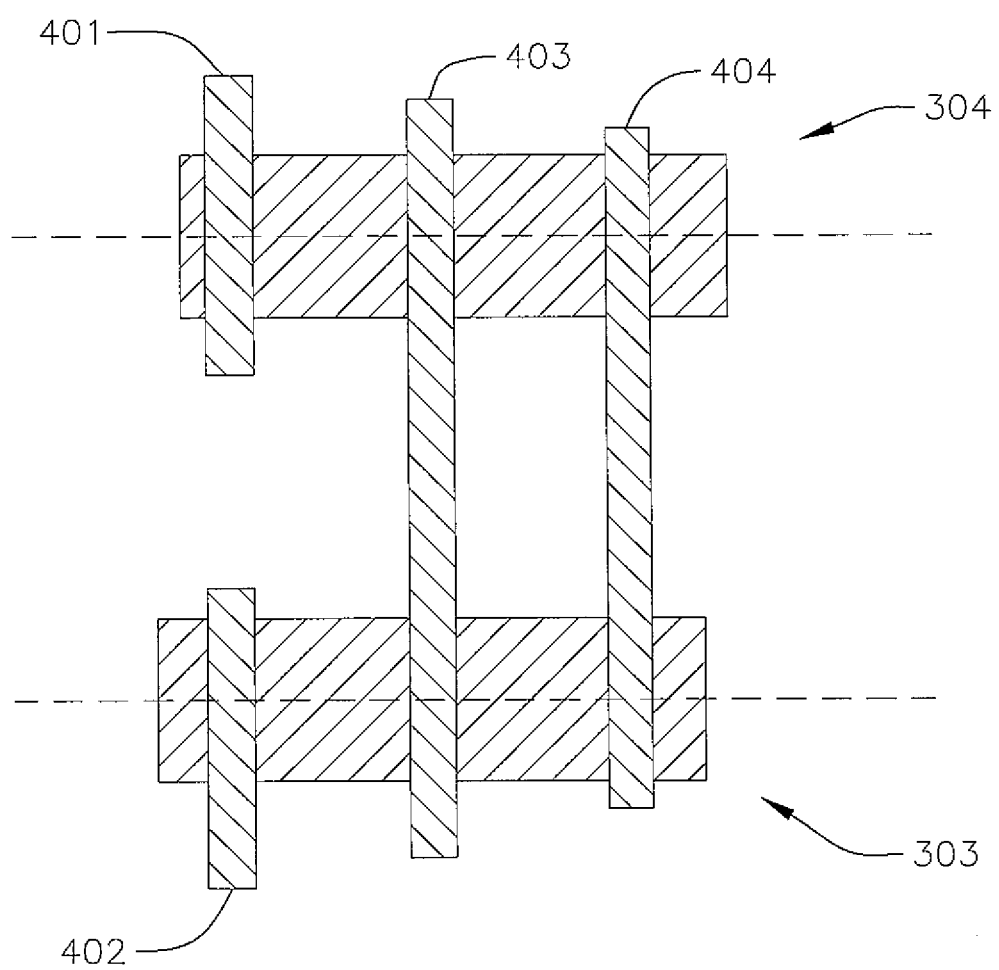
FIG. 4 is a schematic cross-sectional view of a pair of NMOS and PMOS transistors in an inverter configuration to function as a repeater.

As can be seen in FIG. 3, according to one or more example embodiments of the present invention, the repeater 300 also includes a complementary pair of planar FETs 303, 304 (e.g., an NMOS transistor and a PMOS transistor, respectively) formed utilizing the TMD layer 302. Each of the planar FETs 303, 304 has a channel region made of portions of the TMD layer 302. Using the TMD layer 302 as an active layer (e.g., a channel layer), according to one or more example embodiments, the NMOS transistor 303 and the PMOS transistor 304 are respectively formed in a CMOS configuration. The complementary pair of planar FETs 303, 304 may be formed in an inverter configuration to function as a repeater, as illustrated in FIG. 4. When the FETs 303, 304 are in an inverter configuration configured to function as a repeater, a power line 401 is connected to the PMOS transistor 304, a grounding line 402 is connected to the NMOS transistor 303, and gate and drain lines 403, 404, respectively, couple the NMOS and PMOS transistors 303, 304.

The NMOS transistor 303 includes, in addition to a corresponding portion of the TMD layer 302, source/drain (S/D) electrodes 305 and 306, a gate insulation layer 307 on the TMD layer 302 between the S/D electrodes 305, 306, a gate electrode 308 on the gate insulation layer 307, and inter-electrode insulation layers 309 and 310 isolating the gate electrode 308 from the S/D electrodes 305 and 306. The inter-electrode insulation layers 309 and 310 may be made, for example, of nitride. The S/D electrodes 305, 306 may be made, for example, of Sc and/or Ni or any other suitable metal or metals known to those skilled in the art. In other example embodiments, the S/D electrodes 305, 306 may be formed of one or more suitable metals chosen to reduce or minimize the barrier to the underlying source/drain regions, such as, for example, Ti, Ni, Pt, and/or Sc. Further, the gate electrode 308 according to one or more example embodiments may be made of poly-crystalline semiconductor such as, for example, Si, Ge and/or InGaAs, and may be doped N-type.

The PMOS transistor 304 includes, in addition to a corresponding portion of the TMD layer 302, source/drain (S/D) electrodes 311 and 312, a gate insulation layer 313 on the TMD layer 302 between the S/D electrodes 311, 312, a gate electrode 314 on the gate insulation layer 313, and inter-electrode insulation layers 315 and 316 isolating the gate electrode 314 from the S/D electrodes 311 and 312. The S/D electrodes 311 and 312 may be made, for example, of Pd and/or Pt, or any other suitable metal or metals known to those skilled in the art. In other example embodiments, the S/D electrodes 311 and 312 may be formed of one or more suitable metals chosen to reduce or minimize the barrier to the underlying source/drain regions, such as, for example, Ti, Ni, Pt, and/or Sc. Further, the gate electrode 314 according to one or more example embodiments may be made of poly-crystalline semiconductor such as, for example, Si, Ge and/or InGaAs, and may be doped P-type.

The S/D electrode 311 of the PMOS transistor 304 contacts the S/D electrode 306 of the NMOS transistor 303, thereby making the electrical contact for CMOS formation. According to one or more example embodiments, the pair of planar FETs 303, 304 (e.g., the NMOS and PMOS transistors) are formed without any shallow trench isolation (STI) therebetween to isolate them from each other.

In one or both of the pair of FETs 303; 304 according to one or more example embodiments, the gate electrodes 308, 314 and the corresponding gate insulation layers 307, 313, which together define a gate stack, may include one or more suitable non-crystalline materials. The non-crystalline gate material may have a gate depletion width of greater than or equal to 0 nm. In one or more example embodiments, the gate stacks of the NMOS and PMOS transistors 303, 304, respectively, may be made of different non-crystalline materials to have different work functions to control leakage and performance of the NMOS and PMOS transistors 303, 304.

Additionally, as shown in FIG. 3, each of the FETs 303, 304 has S/D regions 317, 318 and 319, 320, respectively, (e.g., underneath and contacting with the S/D electrodes 305, 306, 311, and 312) that are formed from the same crystalline material (e.g., $MoS_2$, $WS_2$ and/or $WSe_2$) of the TMD layer 302 as the channel region below the gate electrodes 308 and 314. Therefore, according to one or more example embodiments of the present invention, the FETs 303, 304 are formed using crystalline, or substantially crystalline, transition metal dichalcogenide materials (e.g., $MoS_2$, $WS_2$ and/or $WSe_2$) in the TMD layer 302. Here, the crystalline material may have a large enough bandgap and high enough mobility to enable performance of a circuit composed of a pair or multiple pairs of the planar FETs 303, 304. The large enough bandgap may generally be greater than or equal to 1 eV, and the high enough mobility may generally be greater than or equal to 75 $cm^2$/V-sec, and more specifically may be greater than or equal to 1.1 eV and greater than or equal to 100 $cm^2$/V-sec, respectively. In one or more example embodiments according to the present invention, the transition metal dichalcogenide materials of the TMD layer 305 may have a thickness of less than 10 monolayers, and more specifically may have a thickness of 1 to 5 monolayers. In one or more example embodiments, a different number of monolayers may be used to tune and control threshold voltage and hence control leakage and driving currents.

In contrast, transistors based on either amorphous or polycrystalline silicon have degraded electrostatics as well as low mobility. For instance, amorphous and polycrystalline silicon materials have mobility in the 10 s of $cm^2$/Vs, whereas transition metal dichalcogenides may have a relatively high mobility in the 100 s of $cm^2$/Vs. Additionally, 2D materials like graphene may fail due to the very small bandgap of graphene. Transition metal dichalcogenides on the other hand may provide a large enough bandgap suitable for low transistor leakage. These materials also offer a symmetric band structure that lead to a balanced inverter based on matched N and P devices.

Additionally, according to one or more example embodiments, the metal regions (e.g., the electrodes 305, 306 and 311, 312) may be in direct contact with the S/D regions 317, 318 and 319, 320, respectively. For example, there may be no silicide formation between the metal regions (e.g., the electrodes 305, 306 and 311, 312) and the S/D regions 317, 318 and 319, 320.

According to one or more example embodiments, the TMD layer 302, and therefore the NMOS and PMOS transistors 303, 304, may be formed on an insulating material of the first ILD layer 301 (e.g., including an oxide material) without using wafer bonding.

The FETs 303, 304 according to one or more example embodiments may have a longer or equal gate length and longer or equal contacted gate pitch than FETs with minimum gate length and minimum contacted gate pitch formed below the upper metal routing layers of the semiconductor device. Here, the longer gate length and longer contacted gate pitch may enable desired properties including, for example, lower short-channel effect and lower parasitic source-drain resistance. Further the FETs 303, 304 may be formed in a sufficiently wide region to have a device width to deliver sufficiently high drive currents compatible with carriers having mobilities that may generally be less than FETs formed below the metal routing layers of the semiconductor device.

The FETs 303, 304 according to one or more example embodiments of the present invention has characteristics of low temperature poly-crystalline gates, doping-less low Schottky source/drain formations, and doping-less channels.

In one or more example embodiments according to the present invention, the FETs 303, 304 may be connected (e.g., electrically connected) to metal lines that may generally have a metal length that is greater than or equal to 3 μm, and more specifically may have a metal length that is greater than or equal to 10 μm.

In one or more example embodiments according to the present invention, the FETs 303, 304, because of their proximity to routing metal routing layer M3, have limited Via connections. According to one or more example embodiments, a repeater/buffer circuit is formed by the FETs 303, 304 together with metal and any Via regions described in reference to one or more example embodiments. The repeater/buffer circuit according to one or more example embodiments may have significantly fewer Vias (i.e., fewer levels of Vias) than a repeater/buffer circuit formed with FETs below the upper metal routing layers of the semiconductor device. For example, the repeater/buffer circuit according to one or more example embodiments may have levels of Vias that are less than or equal to 1.

In a semiconductor device according to one or more example embodiments of the present invention, the interconnect length of the upper metal routing layers M3 and above may be shorter than an interconnect length without such one or more example embodiments.

As can be seen in FIG. 3, the repeater 300, according to one or more example embodiments, includes a second inter-layer dielectric (ILD) layer (a second ILD layer) 321 on the FETs 303, 304. Via openings (or via holes) are formed in the second ILD layer 321 to correspond to the S/D electrode 305 of the NMOS transistor 303, the S/D electrode 312 of the PMOS transistor 304, the S/D electrode 306 of the NMOS transistor 303, and the S/D electrode 311 of the PMOS transistor 304, so as to expose them for making electrical contacts. Through these via holes, metal vias or contacts 322, 323, 324, and 325, respectively, are formed.

As will be described in more detail in reference to the flow diagram of FIG. 5, the FETs 303, 304 according to one or more example embodiments may be processed at low temperatures, which may generally be less than or equal to 500° C., and more specifically may be at temperatures that are less than or equal to 450° C., so as to be compatible with properties of underlying materials (e.g., the upper metal routing layers). The fabrication of transition metal dichalcogenides FET devices can be facilitated by processing technologies such as deposition and selective etching at temperatures lower than 500° C., such as less than 400° C.

Figure 5:
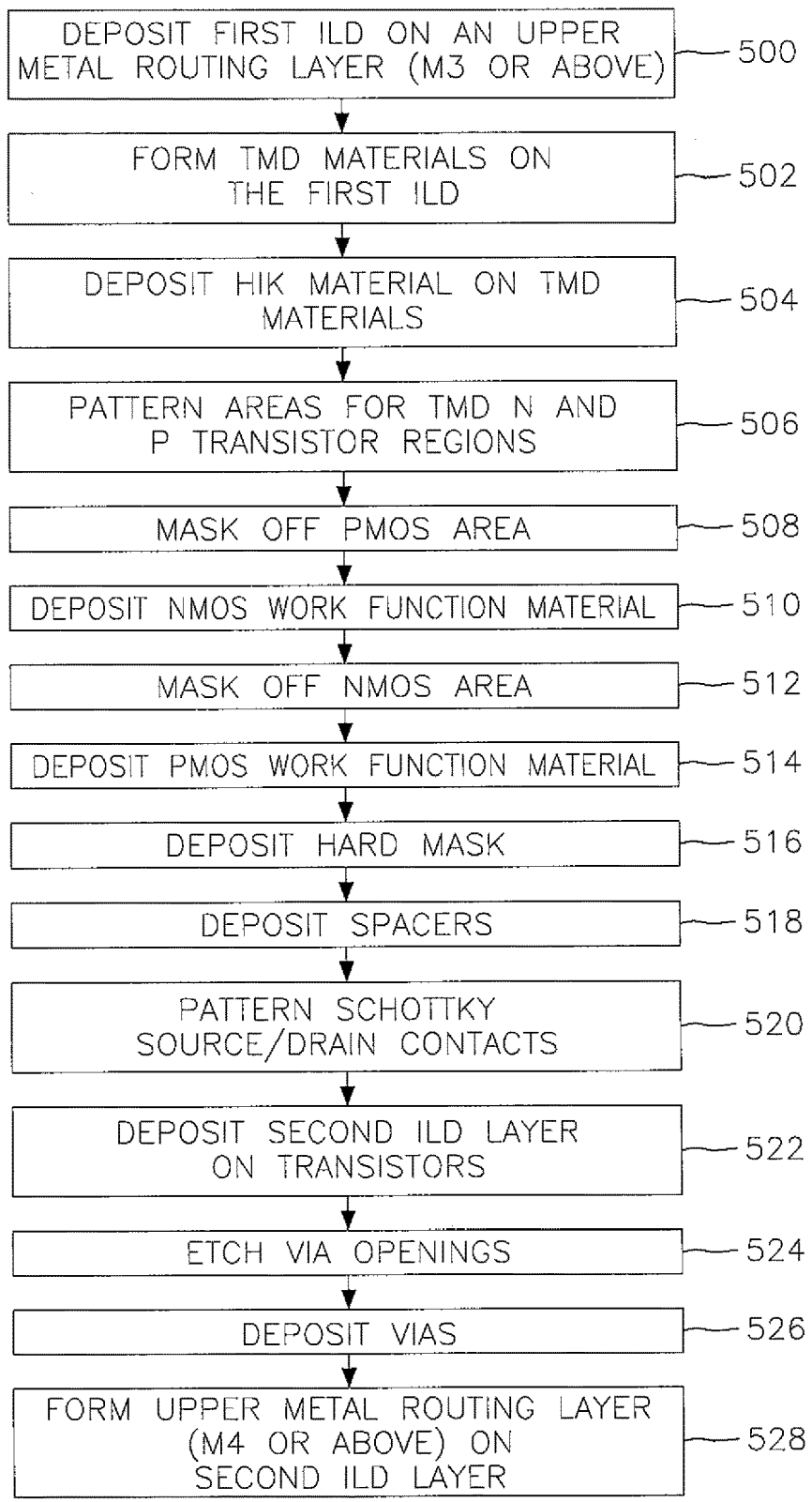
FIG. 5 is a flow diagram illustrating a process of fabricating the repeater in the semiconductor device of FIG. 3 according to one or more example embodiments of the present invention.

FIG. 5 is a flow diagram illustrating a process of fabricating the repeater 300 in the semiconductor device of FIG. 3 according to one or more example embodiments of the present invention.

In block 500, a first inter-layer dielectric (ILD) layer is deposited on top of an upper metal routing layer (e.g., metal routing layer M3 or above) of a semiconductor device. The ILD layer may be deposited by any suitable manufacturing process or technique. Additionally, any standard process or processes known or hereinafter developed may be used to fabricate the semiconductor device up to the upper metal routing layer M3 or above on which the first ILD layer is deposited.

In block 502, one or more transition metal dichalcogenide (TMD) materials, such as, for instance, $MoS_2$, $WS_2$, $WSe_2$, and/or combinations thereof, are formed on the first ILD layer. The TMD materials may be formed monolayer by monolayer (e.g., less than 10 monolayers, such as from 1 to 5 monolayers of crystalline TMD materials) on the first ILD layer to precisely control and tune the thickness. The one or more TMD materials may be formed on the first ILD layer by any suitable manufacturing process or technique, such as, for instance, metal-organic chemical vapor deposition (MOCVD). The direct deposition of monolayers of $WS_2$ on $SiO_2$ inter-layer dialectic (ILD) material has been demonstrated by Kang, Kibum et al. "High-mobility three-atom-thick semiconducting films with wafer-scale homogeneity" Nature 520 (2015): 656-660. DOI: 10.1038/nature14417, the entire content of which is incorporated herein by reference. Additionally, $WS_2$ can be patterned using $XeF_2$ etching gas. The selectivity of $WS_2$ compared to other materials such as spacers encountered during the fabrication of the MOSFET is facilitated by the fact that the unique chemical and physical properties of $MoS_2$ render it unreactive with common acids (such as hydrochloric acid, nitric acid and sulphuric acid) and bases (KOH, and NaOH) at room temperature, as described in Chen, Zhebo et al. "Core-shell MoO3—MoS2 Nanowires for Hydrogen Evolution: A Functional Design for Electrocatalytic Materials."*Nano Letters* 11.10 (2011): 4168-4175. Online. DOI: 10.1021/nl2020476, the entire content of which is incorporated herein by reference.

The one or more TMD materials may be formed on the first ILD layer at any suitable temperature such as, for instance, less than approximately 500° C. (e.g., less than approximately 450° C.). The suitable temperature at which the one or more TMD materials are formed on the first ILD layer may be, for example, a temperature that the materials of the underlying interconnect system (e.g., the copper M3 routing layer) can withstand. Additionally, subsequent device fabrication tasks may be performed at the same or similar low temperature, such as, for instance, 450° C. or less.

In block 504, a high-k dielectric (HiK) material is deposited on the one or more TMD materials that were formed in block 502 to form N and P transistor regions. In one or more embodiments, the deposition of the HiK material may be performed at a low temperature, such as, for example, at a temperature of less than or equal to 450° C. Additionally, in one or more embodiments, the deposition of the HiK material may be performed in a gate-first process (e.g., metal-inserted polysilicon (MIPS)).

In block 506, the method includes patterning areas for TMD N and P transistor regions.

In block 508, a PMOS area of the TMD layer is masked off. The mask may be formed on the TMD layer by any suitable manufacturing technique or process.

In block 510, a low temperature Poly-Semiconductor NMOS workfunction material is deposited on an exposed portion of the TMD layer that was not covered by the mask formed in block 508. In one or more embodiments, the Poly-Semiconductor NMOS workfunction material may be deposited in a gate-first process (e.g., MIPS).

In block 512, an NMOS area of the TMD layer is masked off. The mask may be formed on the TMD layer by any suitable manufacturing technique or process.

In block 514, a low temperature Poly-Semiconductor PMOS workfunction material is deposited on an exposed portion of the TMD layer that was not covered by the mask formed in block 512. In one or more embodiments, the Poly-Semiconductor PMOS workfunction material may be deposited in a gate-first process (e.g., MIPS).

In block 516, a patterned hard mask (e.g., a carbon hard mask) is deposited for use in a subsequent etching process.

In block 518, low temperature spacers are deposited.

In block 520, low temperature metallic Schottky source/drain (S/D) contacts are patterned, for example, at or below 450° C. In one or more embodiments, no dopant activation or epitaxy may be utilized.

In block 522, a second inter-layer dielectric (ILD) layer is deposited on the transistor layer (e.g., on the NMOS and PMOS transistors). The second ILD layer may be deposited on the NMOS and PMOS transistors by any suitable manufacturing process or technique.

In block 524, one or more via openings (or via holes) are etched through the second ILD layer on the transistor layer. The one or more via openings may be formed by any suitable etching technique, such as, for instance, by a dry etching process (e.g., plasma etching).

In block 526, one or more vias for power and signal connection are deposited (e.g., formed by metal deposition) in the one or more via openings in the second ILD layer such that the one or more vias extend from PMOS and NMOS transistors through the second ILD layer.

In block 528, an upper metal routing layer (e.g., metal layer M4 or above) is formed on the second ILD layer. The upper metal routing layer (M4 or above) may be formed of any suitable material, such as copper, and the upper metal routing layer may be formed by any suitable manufacturing process or technique, such as additive patterning (e.g., a damascene process).

Figure 6:
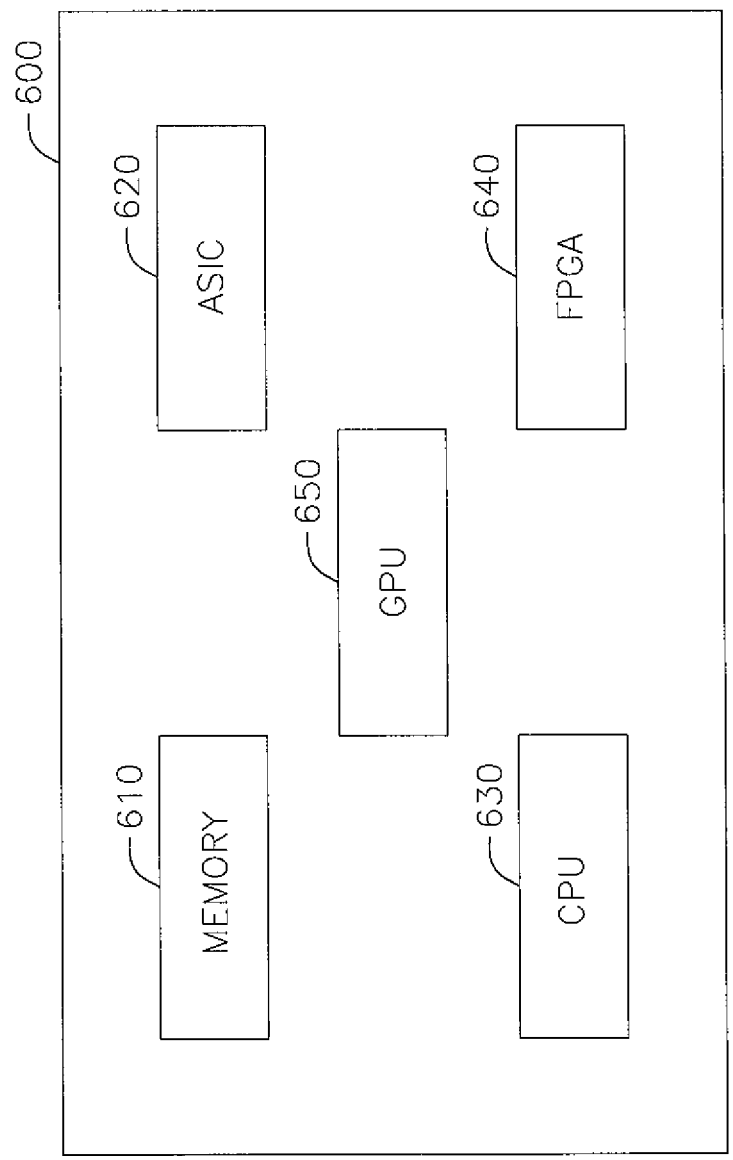
FIG. 6 is a schematic view of an electronic device including a repeater according to one or more embodiments of the present invention.

Referring now to FIG. 6, an electronic device 600 may include at least one of a memory 610, an application specific integrated circuit (ASIC) 620, a central processing unit (CPU) 630, a field programmable gate array (FPGA) 640, and a graphics processing unit (GPU) 650. The repeater/buffer circuit 300 may be included in any one of the memory 610, the ASIC 620, the CPU 630, the FPGA 640, and the GPU 650.

The electronic device 600 may be a stand-alone system that uses the repeater/buffer circuit 300 to perform one or more electrical functions. Alternatively, the electronic device 600 may be a subcomponent of a larger system. For example, the electronic device 600 may be part of a computer, a cellular phone, a personal digital assistant (PDA), a digital video camera (DVC), or other electronic communication device. Alternatively, the electronic device 600 may be the memory 610, the ASIC 620, the CPU 630, the FPGA 640, the GPU 650, a network interface card, or other signal processing card that can be inserted or included in a computer or other larger system.

Although the present invention has been described with reference to the example embodiments, those skilled in the art will recognize that various changes and modifications to the described embodiments may be performed, all without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims, and their equivalents.

What is claimed is:

1. A semiconductor device comprising:
a plurality of metal routing layers; and
a complementary pair of planar field-effect transistors (FETs) on an upper metal routing layer of the plurality of metal routing layers, the upper metal routing layer being M3 or higher;
a first interlayer dielectric on the upper metal routing layer of the plurality of metal routing layers; and
a transition metal dichalcogenide layer comprising one or more transition metal dichalcogenide materials on the first interlayer dielectric, the one or more transition metal dichalcogenide materials selected from the group of materials consisting of MoS2, WS2, WSe2, and combinations thereof,
wherein each of the FETs comprises a channel region comprising the one or more transition metal dichalcogenide materials of the transition metal dichalcogenide layer.

2. The semiconductor device of claim 1, wherein the one or more transition metal dichalcogenide materials has a bandgap of at least 1 eV and a mobility of at least 75 $cm^2$/V-sec.

3. The semiconductor device of claim 2, wherein the bandgap is at least 1.1 eV and the mobility is at least 100 $cm^2$/V-sec.

4. The semiconductor device of claim 1, wherein the one or more transition metal dichalcogenide materials have a thickness of less than 10 monolayers.

5. The semiconductor device of claim 4, wherein the one or more transition metal dichalcogenide materials have a thickness of 1 to 5 monolayers.

6. The semiconductor device of claim 1, wherein the semiconductor does not include a shallow trench isolation (STI) between the pair of planar FETs to isolate them from each other.

7. The semiconductor device of claim 1, wherein each FET of the pair of planar FETs further comprises source and drain regions comprising the one or more transition metal dichalcogenide materials of the transition metal dichalcogenide layer.

8. The semiconductor device of claim 7, wherein each FET further comprises a pair of electrodes directly contacting the source and drain regions with no silicide formation between the pair of electrodes and the source and drain regions.

9. The semiconductor device of claim 1, wherein the complementary pair of planar FETs are in an inverter configuration.

10. The semiconductor device of claim 1, wherein the FETs are arranged in a repeater/buffer circuit consisting of one Via or no Vias.

11. The semiconductor device of claim 1, wherein each FET comprises a gate stack comprising non-crystalline materials.

12. A semiconductor device comprising:
a plurality of metal routing layers;
a first interlayer dielectric on an upper metal routing layer of the plurality of metal routing layers, the upper metal routing layer being M3 or greater;
a transition metal dichalcogenide (TMD) layer comprising one or more transition metal dichalcogenide materials on the first interlayer dielectric, the one or more transition metal dichalcogenide materials selected from the group of materials consisting of $MoS_2$, $WS_2$, $WSe_2$, and combinations thereof;
a PMOS transistor; and
an NMOS transistor, the PMOS and NMOS transistors forming a complementary pair of planar FETs on the TMD layer, each of the FETs comprising a channel region and source and drain regions, the channel, source, and drain regions each comprising the one or more transition metal dichalcogenide materials of the TMD layer.

13. The semiconductor device of claim 12, wherein the one or more transition metal dichalcogenide materials have a thickness of less than 10 monolayers.

14. The semiconductor device of claim 12, wherein the semiconductor device is provided without a shallow trench isolation (STI) between the PMOS transistor and the NMOS transistor.

15. The semiconductor device of claim 12, further comprising a repeater/buffer circuit comprising the PMOS transistor and the NMOS transistor, the repeater/buffer circuit consisting of one Via or no Vias.

16. A semiconductor device comprising:
a plurality of metal routing layers;
a complementary pair of planar field-effect transistors (FETs) on an upper metal routing layer of the plurality of metal routing layers, the upper metal routing layer being M3 or higher, wherein each of the FETs comprises a channel region of a crystalline material;
a first interlayer dielectric on the upper metal routing layer of the plurality of metal routing layers; and
a transition metal dichalcogenide (TMD) layer comprising one or more transition metal dichalcogenide materials on the first interlayer dielectric, the one or more transition metal dichalcogenide materials selected from the group of materials consisting of MoS2, WS2, WSe2, and combinations thereof.

17. The semiconductor device of claim 16, wherein each of the FETs further comprises a source region and a drain region, and wherein the channel region, the source region, and the drain region of each of the FETs each comprise the one or more transition metal dichalcogenide materials of the TMD layer.

* * * * *